(12) United States Patent
Asakawa

(10) Patent No.: US 7,737,547 B2
(45) Date of Patent: Jun. 15, 2010

(54) DUMMY BURIED CONTACTS AND VIAS FOR IMPROVING CONTACT VIA RESISTANCE IN A SEMICONDUCTOR DEVICE

(75) Inventor: Kazuhiko Asakawa, Kanagawa (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 730 days.

(21) Appl. No.: 11/477,522

(22) Filed: Jun. 30, 2006

(65) Prior Publication Data

US 2007/0018282 A1    Jan. 25, 2007

(30) Foreign Application Priority Data

Jul. 25, 2005  (JP) .............................. 2005-214215

(51) Int. Cl.
    *H01L 23/12*  (2006.01)
(52) U.S. Cl. .................. 257/700; 257/758; 257/774; 257/786; 257/E23.011; 257/E23.145

(58) Field of Classification Search ....................... None
    See application file for complete search history.

(56) References Cited

U.S. PATENT DOCUMENTS

| 6,486,558 B2 * | 11/2002 | Sugiyama et al. | ............ 257/758 |
| 6,693,315 B2 * | 2/2004 | Kuroda et al. | ............... 257/288 |
| 2005/0167842 A1 * | 8/2005 | Nakamura et al. | .......... 257/758 |

FOREIGN PATENT DOCUMENTS

| JP | 06-085080 | 3/1994 |
| JP | 2000-208703 | 7/2000 |

* cited by examiner

*Primary Examiner*—Alonzo Chambliss
(74) *Attorney, Agent, or Firm*—Volentine & Whitt, P.L.L.C.

(57) ABSTRACT

A semiconductor device includes a semiconductor substrate having a plurality of conductive layers. The device further includes buried contacts and buried vias, which connect the interconnect layers respectively. At least one of the contacts and vias are dummy contacts and dummy vias.

16 Claims, 5 Drawing Sheets

DUMMY BURIED CONTACTS AND VIAS FOR IMPROVING CONTACT VIA RESISTANCE IN A SEMICONDUCTOR DEVICE

BACKGROUND OF THE INVENTION

1. Field of the Invention

The present invention relates to a semiconductor device and a fabrication method thereof, and more particularly to a semiconductor device for improving the characteristics of contact (via) resistance in the entire semiconductor device and to a fabrication method thereof.

2. Description of the Related Art

A typical semiconductor device will be described with reference to FIGS. 1A and 1B. FIG. 1A is a plan view depicting a part of a top face of a typical semiconductor device (a semiconductor chip). FIG. 1B is a cross-sectional view of FIG. 1A sectioned at the dashed line 1B to 1B.

As seen from FIG. 1A and FIG. 1B, a typical semiconductor device 100 includes a semiconductor substrate 112.

This semiconductor substrate 112 has a first face 112a and a second face 112b which faces the first face 112a. In the first face 112a side, an element 113, such as a transistor, is formed, and on the first face 112a, a first insulation film 114 is formed covering the element 113.

In the first insulation film 114, a contact hole 116 is formed, which reaches the element 113 through the first insulation film 114. This contact hole 116 is filled with a conductive material to form a buried contact 116a in the contact hole 116.

A first interconnect section 122 is electrically connected to a top face 116aa of the buried contact 116a. The first interconnect section 122 extends on a surface 114a of the first insulation film 114. A line length of the first interconnect section 122 has a relatively long length, and is, for example, within a range of 1 mm to 5 mm.

A second insulation film 130 is formed to cover the surface 114a of the first insulation film 114 and the first interconnect section 122.

In the second insulation film 130, a via hole 132 is formed which extends through the second insulation film 130 to reach a part of the first interconnect section 122. This via hole 132 is filled with a conductive material so as to form a buried via 132a.

In this case, an area ratio of opening areas of the contact hole 116 and the via hole 132 with respect to a total surface area of the semiconductor device 100 is 2% or less. Merely one or two or the like via holes 132 are formed in the entire semiconductor device 100.

A second interconnect section 142 extends on a surface 130a of the second insulation film 130. The second interconnect section 142 is electrically connected to a top face 132aa of the buried via 132a.

Now a cumulative resistance distribution of the buried contacts 116a and the buried vias 132a in the typical semiconductor device 100 having the above-mentioned configuration will be described with a reference to FIG. 2.

FIG. 2 is a graph depicting cumulative resistance distributions of a semiconductor device having the above-mentioned configuration. A line length of an interconnect is 1 mm. The ordinate represents cumulative resistance distributions (%) and the abscissa represents resistance values ($\Omega$) of buried contacts or buried vias. A phantom line A in FIG. 2 represents a set of comparison data, which indicates measured values when the interconnects section 122 is not grounded. A phantom line B in FIG. 2 represents measured values in case buried contacts are formed and the interconnect section 122 is grounded thereby.

As seen from the phantom line A in FIG. 2, across thereof each of the resistance values is about 10$\Omega$ since the interconnect section 122 is not grounded, merely a little dispersion is observed in the resistance distribution.

As seen from the phantom line B in FIG. 2, a set of comparison data indicates that about 50% of the measured resistance values have respectively higher values, such as 50$\Omega$, and the resistance distribution shows a larger dispersion.

Japanese Patent Kokai No. 2000-208703 discloses a configuration of a semiconductor device wherein when a potential dividing circuit is formed in which a plurality of resistance elements are arranged, dummy patterns of resistance elements are arranged outside of resistance elements located at both ends so that fabrication dispersion is avoided by making uniform a density of paths contained in an entire pattern.

Japanese Patent Kokai No. H06-085080 discloses a fabrication method of a semiconductor device for preventing a generation of contact defects due to a dispersion of an etching speed caused by an in-plane distribution density of contact holes in an etch back steps performed after filling contact holes with tungsten (W), wherein dummy contact holes, to which an interconnect is not connected, are opened near predetermined contact holes, both predetermined contact holes and dummy contact holes are filled with conductive material, and an etch back step is performed.

Such a problem has been encountered in a semiconductor device having buried contacts and buried vias of the above-mentioned configuration, that a buried contacts and buried vias have higher resistance so as to causes a drop in voltage and a path delay in a circuit operation, which adversely affects electric characteristics of the device.

Therefore a technology for providing a semiconductor device having a configuration is desired, which can stabilize a circuit operation by making contact (via) resistance distribution between layers of a semiconductor to be less-dispersed.

SUMMARY OF THE INVENTION

A semiconductor device according to the present invention includes a following configuration.

The semiconductor device has a semiconductor substrate. The semiconductor substrate has a first face and a second face which faces the first face. The semiconductor substrate also has a chip area on the first face, and a plurality of interconnect section formation areas which exist in the chip area.

A first insulation film is formed on the first face of the semiconductor substrate covering an element formed in the chip area.

In the interconnect section formation area of the first insulation film, one or more contact holes are formed, which reach the element through the first insulation film. Buried contacts are formed by filling these contact holes with conductive material.

A plurality of dummy contact holes are arranged outside of the interconnect section formation area around the interconnect section formation area. A dummy buried contact is formed by filling the dummy contact hole which reaches the first face through the first insulation film and without being connected to an element.

A first interconnect layer includes a plurality of first interconnect sections and dummy first interconnect sections. A first edge of the first interconnect section is electrically connected to a buried contact, and a second edge thereof extends on a surface of the first insulation film. First dummy interconnect sections are connected to the dummy buried contacts.

A second insulation film covers the surface of the first insulation film and the first interconnect layer.

A via hole is formed through the second insulation film to reach the second edge of the first interconnect section. A buried via fills this via hole.

A plurality of dummy via holes are formed to reach a part of a plurality of the first dummy interconnect sections. A plurality of dummy buried vias are formed by filling the dummy via holes.

A second interconnect layer includes a second interconnect section and second dummy interconnect sections. The second interconnect section is electrically connected to the buried via, and extends on the surface of the second insulation film. The second dummy interconnect sections are connected to the dummy buried vias.

According to the semiconductor device according to the present invention, the dummy buried vias and interconnect sections which have no electrical functions are formed so that a circuit operation can be stabilized because of making the contact (via) resistance distribution contacts between layers of the semiconductor to less dispersed.

A method for fabricating a semiconductor device according to the present invention includes the following steps.

A semiconductor substrate having a first face and a second face which faces the first face is prepared.

A chip area and a plurality of interconnect section formation areas which exist in the chip area are formed in the first face.

A element is formed in the first face of the semiconductor substrate.

A first insulation film covering the element is formed on the first face.

One or more contact holes are formed in the interconnect section formation area of the first insulation film, which reach the element through the first insulation film. A plurality of dummy contact holes are formed, which are arranged outside of the interconnect section formation area around the interconnect section formation area and reach the first face without being connected to the element through the first insulation film.

Buried contacts are formed which fill the contact holes. Dummy buried contacts are formed which fill the dummy contact holes.

A first interconnect layer is formed which includes a plurality of first interconnect sections each having a first edge electrically connected to a buried contact and a second edge extending on the surface of the first insulation film. The first interconnect layers further includes first dummy interconnect sections respectively connected to dummy buried contacts.

The second insulation film is formed which covers a surface of the first insulation film and the first interconnect layer.

A via hole is formed which extends through the second insulation film to reach the second edge of the first interconnect section, and a plurality of dummy via holes are formed each of which extends to a part of each of the plurality of first dummy interconnect sections.

The buried via is formed which fills the via hole. Dummy vias are formed which respectively fill the dummy via holes.

A second interconnect layer is formed which includes a second interconnect section which is electrically connected with the buried via and extends on the surface of the second insulation film. The second interconnect layers further includes a second dummy interconnect section connected to a dummy buried via.

According to the fabrication method of the semiconductor device according to the present invention, dummy buried vias and dummy interconnect sections can be formed in a predetermined area without increasing processing steps. Therefore the semiconductor device having the above-mentioned configuration can be fabricated efficiently at a low cost.

DETAILED DESCRIPTION OF THE INVENTION

Embodiments of the present invention will now be described with reference to drawings. Drawings merely show a shape, size and positional relationship of each composing element, general enough to assist understanding, and the present invention is not limited to examples in drawings.

In a following description, specific materials, conditions and numerical conditions may be used, but these are just preferred examples, and the present invention is not limited to these examples.

In each drawing used in a following description, the same composing elements are denoted with the same reference symbols, and redundant description thereof may be omitted.

(Configuration of a Semiconductor Device)

A configuration of a semiconductor device according to the present invention will be described with reference to FIGS. 3A and 3B.

Figure 3A:
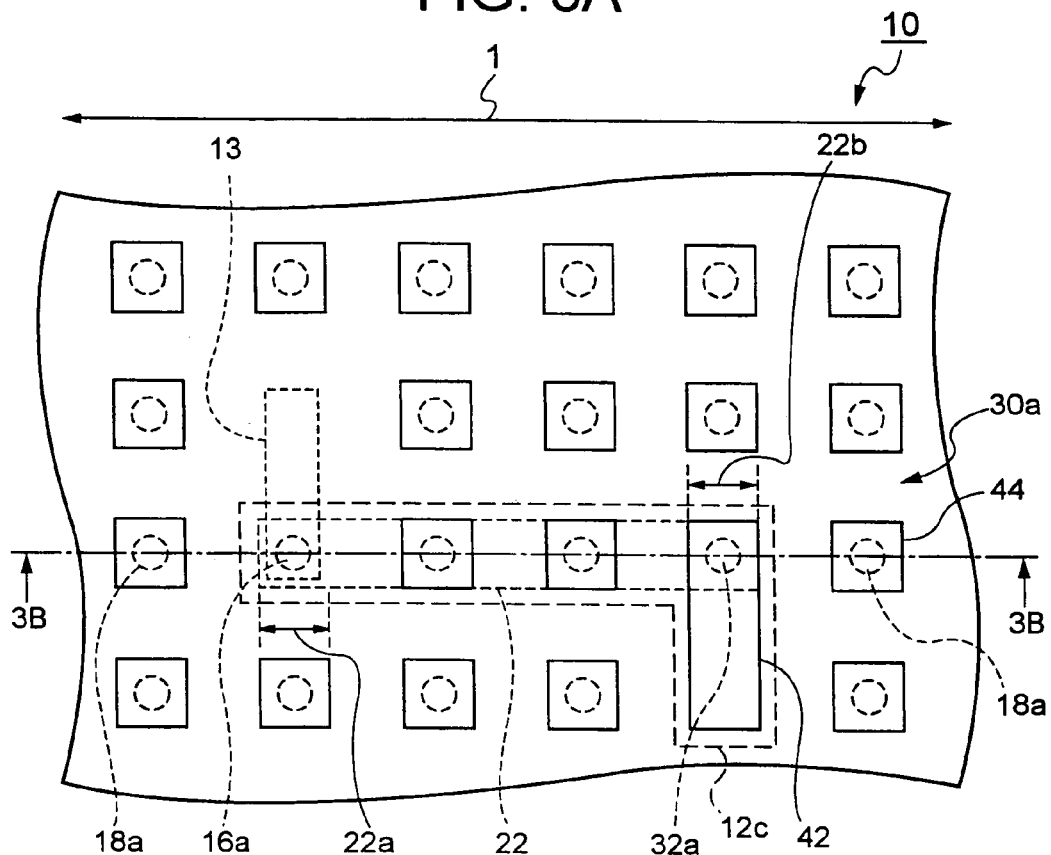
FIG. 3A is a plan view depicting a part of a top face of an area of a semiconductor device and FIG. 3B is a cross-sectional view of FIG. 3A sectioned at a dashed line 3B to 3B.

FIG. 3A is a plan view depicting a part of a top face of the semiconductor device (semiconductor chip) according to the present invention. FIG. 3B is a cross-sectional view of FIG. 3A sectioned by a dashed line 3B-3B.

A semiconductor device 10 has many semiconductor elements 13, such as transistors, formed on a semiconductor substrate 12 such as a silicon substrate.

The semiconductor substrate 12 has a first face 12a and a second face 12b which faces the first face 12a. On the first face 12a of the semiconductor substrate 12, a chip area 1 and a plurality of interconnect section formation areas 12c are formed, which exist in the chip area 1. The chip area 1 is an area having an essential functional part of the semiconductor device 10, such as the elements 13. The interconnect section formation area 12c is an area where an interconnect section is formed which is mentioned later.

A first insulation film 14 is formed on the first face 12a of the semiconductor substrate 12 covering the elements 13 formed in the chip area 1.

The first insulation film 14 is a conventionally known insulation film, such as silicon oxide film.

In the interconnect section formation area 12c of the first insulation film 14, one or more contact holes 16 are formed, which reach the element 13 through the first insulation film 14. A buried contact 16a is formed by filling the contact hole 16.

A plurality of dummy contact holes 18 are arranged outside of the interconnect section formation area 12c around the interconnect section formation area 12c. Dummy buried contacts 18a are formed by filling dummy contact holes 18, and reaches the first face 12a through the first insulation film 14 without being connected to the element 13.

It is preferable that a material of the buried contact 16a and the dummy buried contacts 18a is a conductive material, such as tungsten (W). In the contact hole 16 and dummy contact holes 18, an arbitrary appropriate structure may be formed, which is not illustrated, a barrier metal film, for example, made of such material as a titanium (Ti) and a titanium nitride (TiN).

A first interconnect layer 20 is formed extending on a surface 14a of the first insulation film 14. The first interconnect layer 20 includes a plurality of first interconnect sections 22 and dummy first interconnect sections 24.

The first interconnect layer 20 can have a conventionally known configuration. In other words, interconnects made of aluminum (Al) or copper (Cu) may be used. The first interconnect layer 20 may be include a plurality of layers which respectively include a material, such as titanium or titanium nitride.

The above-mentioned plurality of interconnects have different line lengths. A line length of the first interconnect section 22 from an end of a first edge 22a to an end of a second edge 22b is relatively long within a range of 1 mm to 5 mm in this example.

In the first interconnect section 22, the first edge 22a is electrically connected to the buried contact 16a, and the second edge 22b extends on the surface 14a of the first insulation film 14.

One or more first dummy interconnect sections 24 are connected to and positioned directly on one or more dummy buried contacts 18a. The line width and line length of the first dummy interconnect section 24 can be arbitrary, if both the line width and line length are within a range that does not disrupt an object of the present invention. It is preferable that this line width is a line width conforming to the fabrication rule of the first interconnect layer 20, and this line length is a length that covers the top faces 18aa of the dummy buried contacts 18a.

A second insulation film 30 is formed covering the first interconnect layer 20, the top of the first interconnect sections 22 and the first dummy interconnect sections 24, and the surface 14a of the first insulation film 14 which is exposed via the first interconnect layer 20. The second insulation film 30 can be formed using a conventionally known material for forming a multi-layer interconnect structure, such as a silicon oxide film.

A via hole 32 is formed, which extends through the second insulation film 30 up to the second edge 22b of the first interconnect section 22.

A buried via 32a fills this via hole 32. In other words, the buried via 32a is electrically connected to the first interconnect section 22.

A plurality of dummy via holes 34 are formed through a part of the plurality of first dummy interconnect sections 24. Dummy buried vias 34a are formed by filling the dummy via holes 34. In other words, the dummy buried vias 34a are connected to the first dummy interconnect sections 24. The buried via 32a and dummy buried vias 34a can have the same configuration as the above-mentioned buried contact 16a and dummy buried contacts 18a respectively.

A second interconnect layer 40 includes a second interconnect section 42 and second dummy interconnect sections 44. The second interconnect section 42 reaches a top face 32aa of the buried via 32a and is electrically connected to the buried via 32a. The second dummy interconnect sections 44 reach a top faces 34aa of the dummy buried vias 34a and connect to the dummy buried vias 34a. The second interconnect section 42 and second dummy interconnect sections 44 extend on a surface 30a of the second insulation film 30.

The second interconnect layer 40 can have the same configuration as the first interconnect layer 20.

In a following description, the dummy buried contacts 18a, first dummy interconnect sections 24, dummy buried vias 34a and second dummy interconnect sections 44 having the above described configuration are collectively called the "dummy structure 50".

As seen from FIG. 3A, a plurality of dummy structures 50 are formed surrounding the interconnect section formation area 12C, and the first interconnect section 22 and second interconnect section 42 which are formed in the interconnection formation area 12c, and the element 13 which is connected to the first interconnect section 22 without being in contact with any of these sections.

It is preferable that this plurality of the dummy structures 50 are formed on an entire face (the entire face of first face 12a of a semiconductor substrate 12) of the semiconductor device 10. By this, a dispersion of contact (via) resistance can be more effectively prevented.

This plurality of dummy structures 50 may be formed for each of a partitioned area when a predetermined surface on the first face 12a of the semiconductor device 10 is partitioned into a plurality of areas, regardless a line length of the first interconnect section 22. It is preferable that the plurality of partitioned areas are set in advance when the chip area 1 is set such that the chip area 1 is partitioned into sections with an equal area in a matrix.

The partitioned area where the dummy structures 50 are formed is preferably a partitioned area where a ratio of the opening area of the contact hole 16 and via hole 32 is less than 2% to the surface area of the partitioned area.

An area of each partitioned area can be an arbitrary size according to a design of a semiconductor device, but it is preferable to set the partitioned area having each edge of about 100 µm, that is 0.01 mm$^2$.

In this example, the plurality of dummy structures 50 are formed in a matrix so as to avoid the interconnect section formation area 12c, the first interconnect section 22 and the second interconnect section 42 formed in the interconnect section formation area 12c, and the element 13 connected to the first interconnect section 22. In other words, the plurality of dummy structures 50 positioned in the vertical and horizontal directions are formed to be positioned with an equal space between each other.

The space between the plurality of dummy structures 50 (distance) can be arbitrary within a range that does not disrupt an object of the present invention, but is preferably as small as possible. Specifically it is preferable that this space is a minimum space which a fabrication process rule in a predetermined semiconductor device allows. This is the same for the respective space between the dummy structures 50 and the first interconnect section 22 and the second interconnect section 42 formed in the interconnect section formation area 12c and the element 13 connected with the first interconnect sections 22. In this way, a dispersion of contact (via) resistance can be more effectively suppressed.

To solve the above-mentioned problems, conditions of a semiconductor device to which the dummy structures 50 of the present invention are applied are as follows.
(1) The first interconnect section 22 is electrically connected to the buried contact 16a.
(2) The line length of the first interconnect section 22 from the first edge 22a to the second edge 22b is within a range of 1 mm to 5 mm.
(3) The number of via holes 32 (buried vias 32a) that extend through the second insulation film 30 is one or two.
(4) The ratio of the opening area of the contact hole 16 and via hole 32 is a maximum of 2%, which is to the surface area of the chip area 1 or the area of the partitioned area.

If the dummy structures 50 having the above-mentioned structure are applied to a semiconductor device which conforms to one or more conditions of these conditions, the contact (via) resistance distribution can be made less dispersed. As a result, a circuit operation can be stabilized more.

Figure 5:
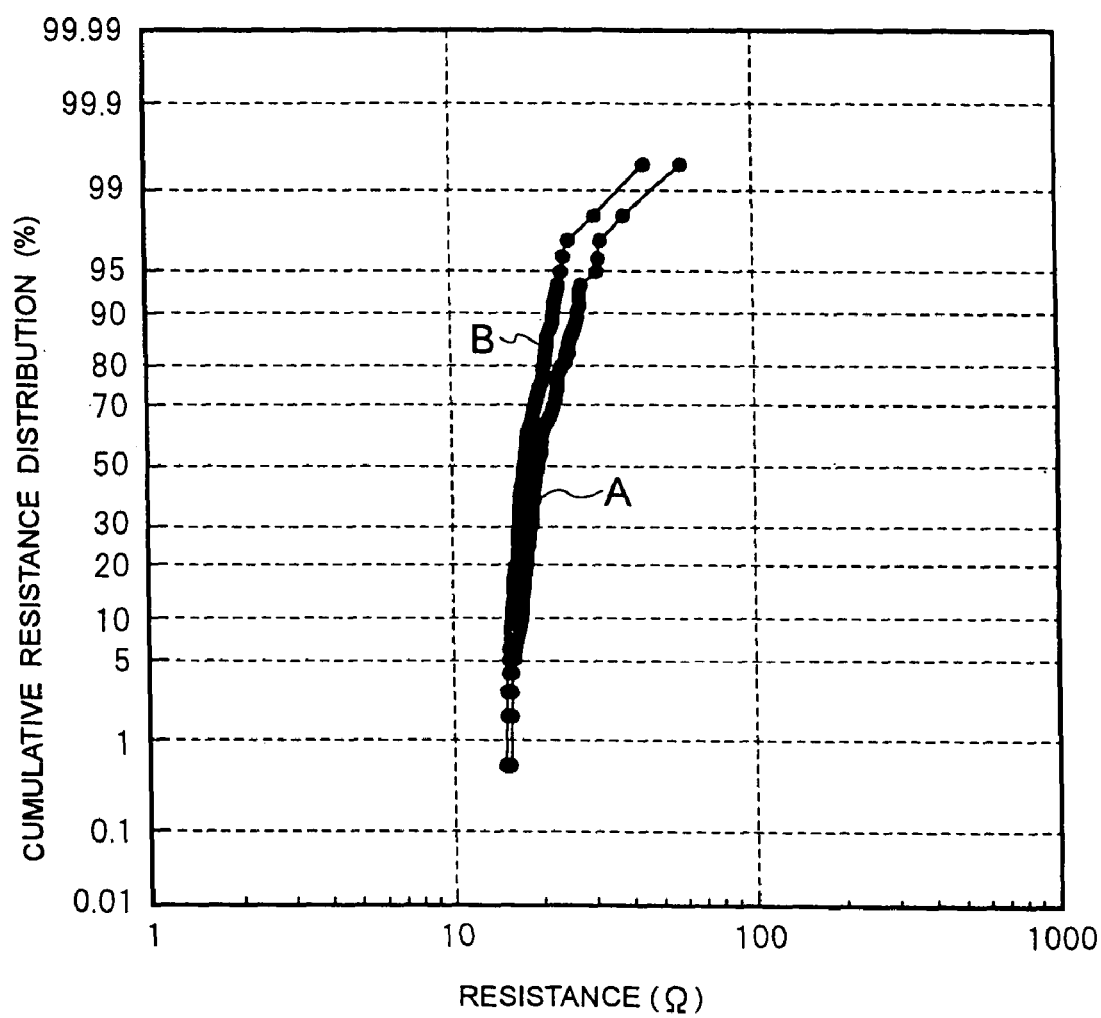
FIG. 5 is a graph depicting cumulative resistance distributions of a semiconductor device having a configuration according to the invention.

With reference to FIG. 5, a cumulative resistance distribution of a buried contact 16a and buried via 32a in a semiconductor device 10 of the present invention will be described.

FIG. 5 is a graph depicting a cumulative resistance distribution of a semiconductor device of the present invention, that is a semiconductor device having dummy structures 50. A line length is 1 mm. A diameter of a dummy buried contact 18a is 0.36 μm. A planar size of a first dummy interconnect section 24 is 0.8 μm×0.8 μm. A diameter of the dummy buried via 34a is 0.26 μm. A planar size of a second dummy interconnect section 44 is 0.8 μm×0.8 μm. The dummy buried contact 18a is connected to the active area of which planar size is 0.8 μm×0.8 μm. A space between the dummy structures 50 is 0.8 μm (1.6 μm pitch). A minimum space between the dummy structures 50 and an interconnect is 1 μm. An ordinate indicates a cumulative resistance distribution (%), and a abscissa indicates a magnitude of resistance values (Ω) of the buried contact or buried via. As seen from a phantom line A in FIG. 5, measurement values in the case when a buried contact is formed by which the contact is grounded are shown, that is in a case of a configuration corresponding to a semiconductor device of the present invention. As seen from a phantom line B in Fig. 5, measurement values in the case when a contact is not grounded by a buried contact are shown.

As seen from the phantom line B in FIG. 5, if the grounded contact is not formed, about 50% of buried contacts or buried vias have a 15Ω resistance value.

Figure 1A:
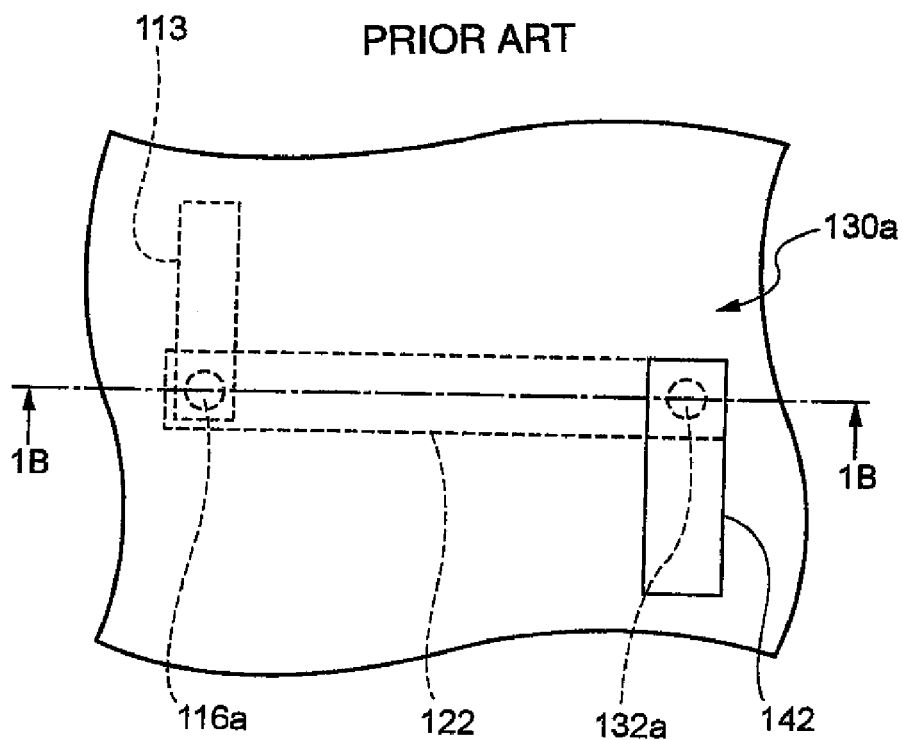
FIG. 1A is a plan view depicting a part of a top face of an area of a typical semiconductor device (a semiconductor chip) and FIG. 1B is a cross-sectional view of FIG. 1A sectioned at a dashed line 1B to 1B.
Figure 1B:
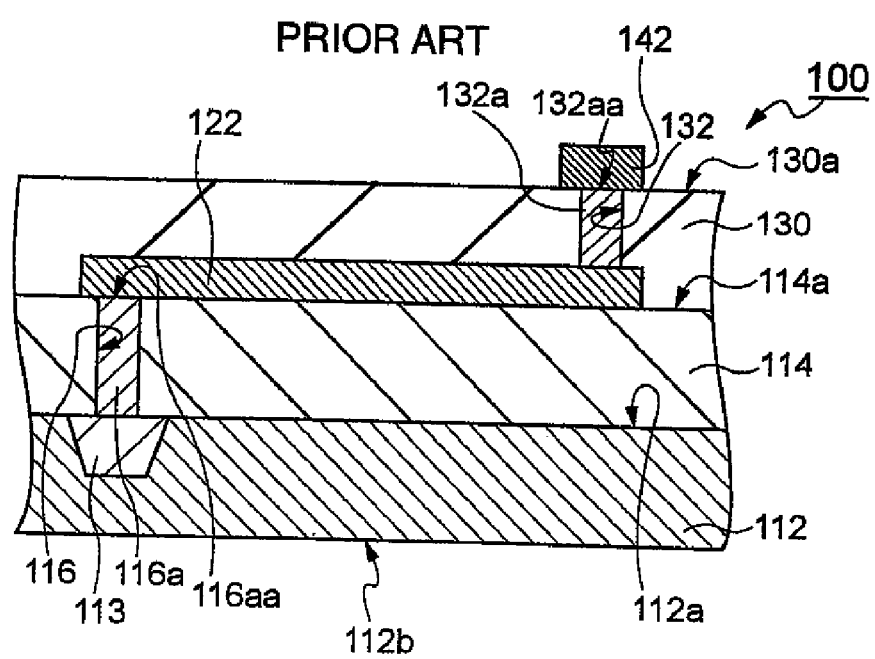
Figure 2:
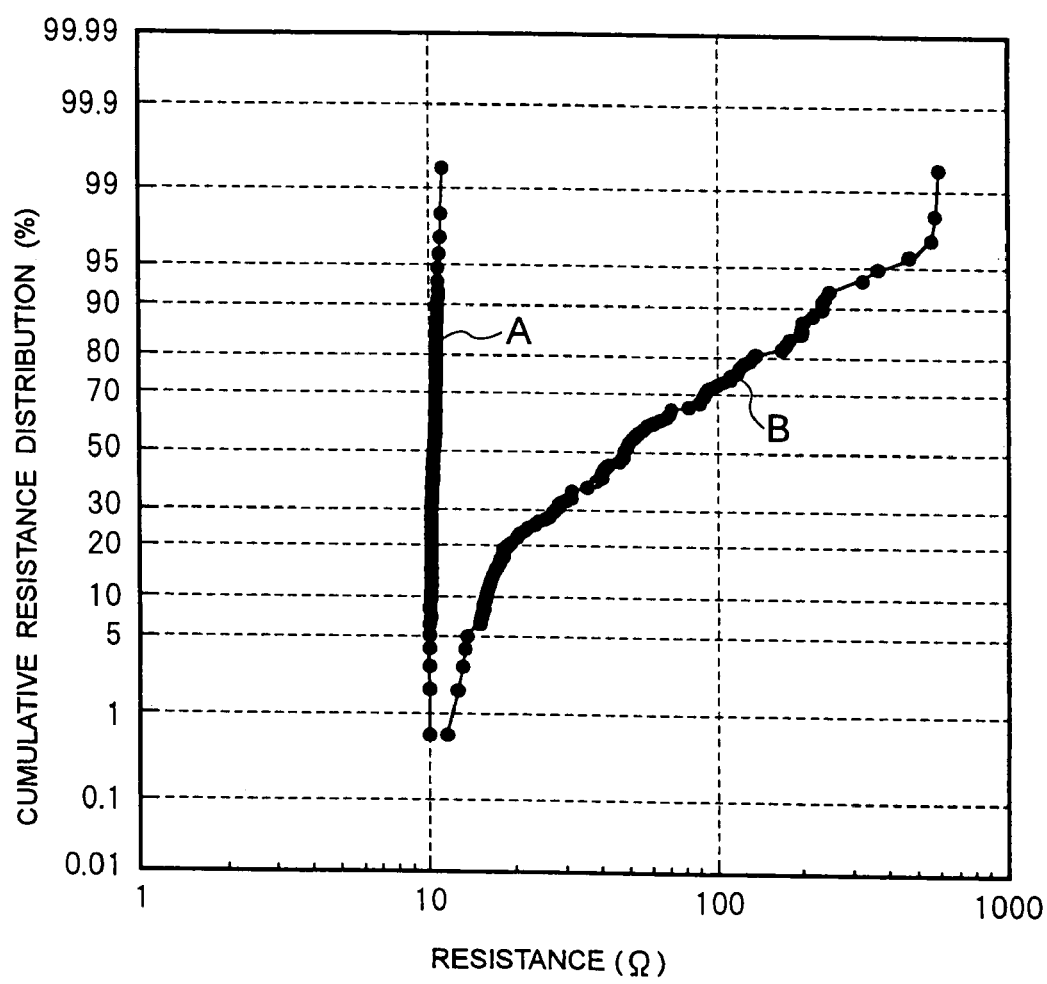
FIG. 2 is a graph depicting cumulative resistance distributions of contacts interconnecting layers in a typical semiconductor device.

As seen from phantom line A in FIG. 5, compared with phantom line B in FIG. 2 described above, about 50% of the buried contacts or buried vias are about 20Ω, which is a magnitude of a resistance value which is equivalent to but slightly lower than that of phantom line B in FIG. 5, and a resistance distribution on a surface is decreased even more.

(A Method for Fabricating of a Semiconductor Device)

A method for fabricating of a semiconductor device of the present invention will be described with reference to FIG. 4. A conventionally known configuration, such as an insulation film, a contact hole, a via hole and an interconnect, can be formed according to a conventionally known ordinary method. Therefore in this section, formation steps of dummy structures 50 are mainly described.

Figure 3B:
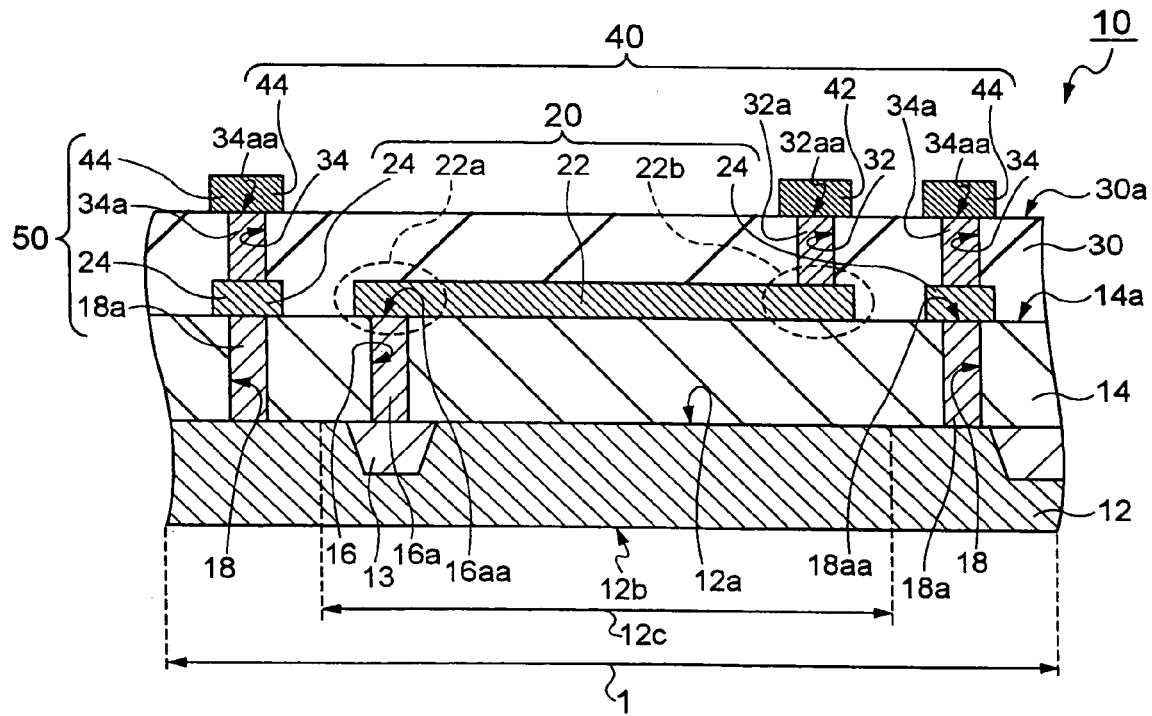
Figure 4A:
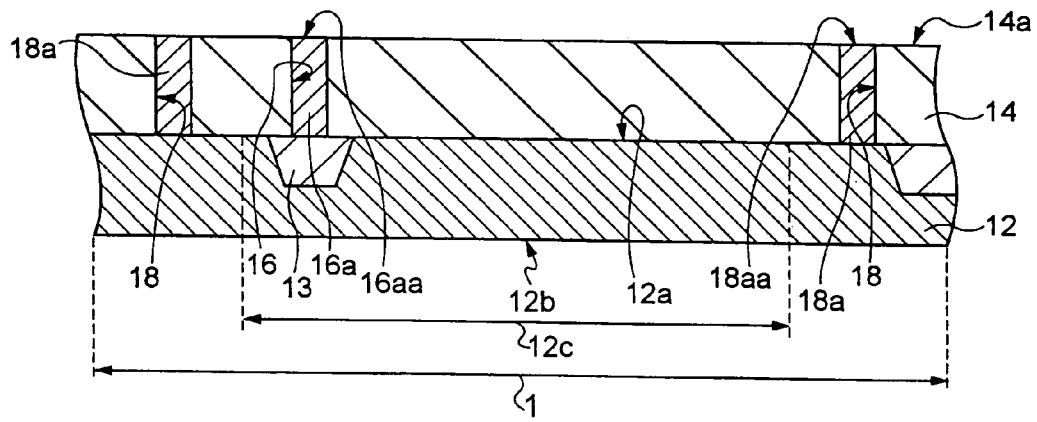
FIGS. 4A, 4B and 4C are cross-sectional views sectioned at the same line as FIG. 3B, depicting fabrication steps of a semiconductor device.
Figure 4B:
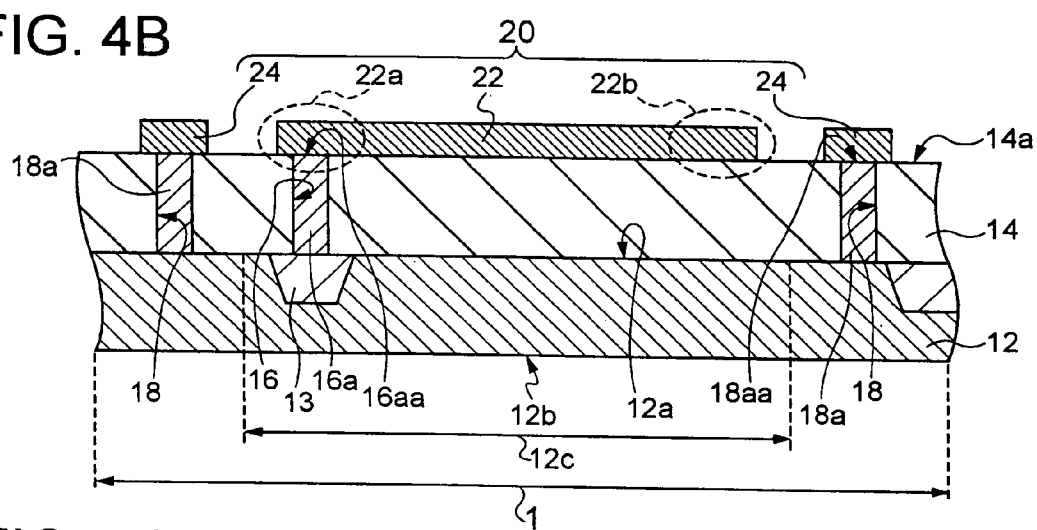
Figure 4C:
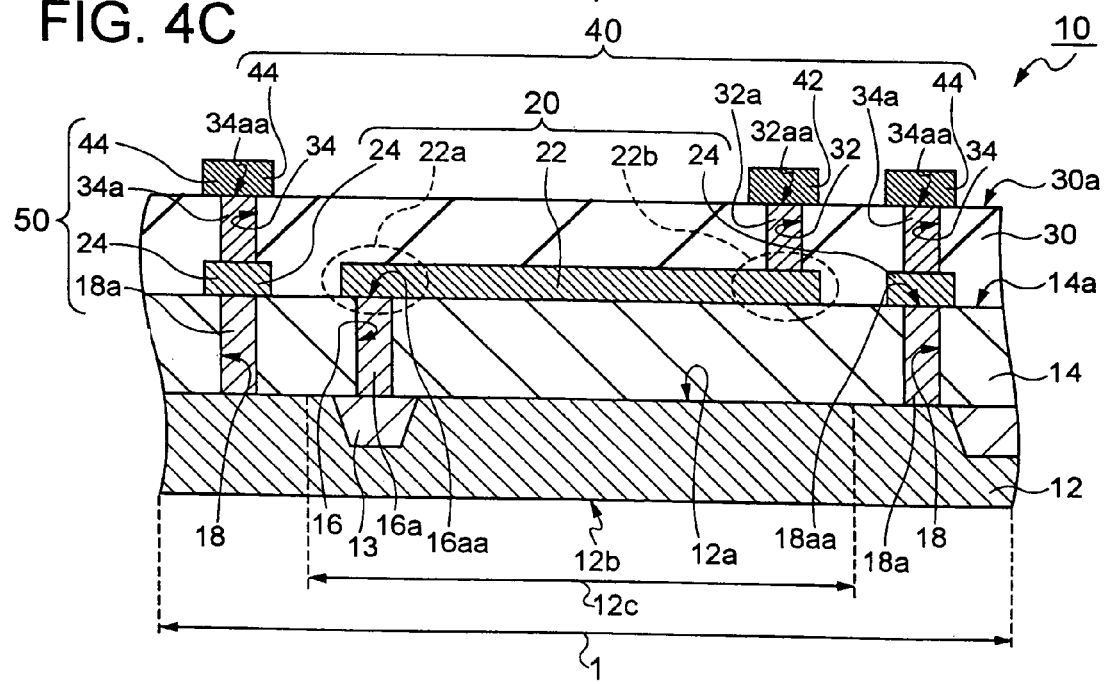

FIGS. 4A, 4B and 4C are cross-sectional views when the semiconductor device during the fabrication is sectioned in the same way as FIG. 3B.

As seen from FIG. 4A, a semiconductor substrate 12 is prepared which have a first face 12a and a second face 12b which faces the first face 12a.

A chip area 1 and a plurality of interconnect section formation areas 12c which exist in the chip area 1 are set on the first face 12a. Arrangement positions (a diameter, a space, and the number of units) of dummy contact holes (18) are decided, which are formed outside of the interconnect section formation areas 1.

Here a plurality of partitioned areas, which are not illustrated, are set on the first face 12a side, of which partitioned areas that match the above-mentioned conditions (4) are selected in advance. By selecting the partitioned areas for forming the dummy structures 50 in advance in this way, a design data volume to be added during design can be decreased. Therefore the file operations during design can be simplified, and a fabrication operation efficiency can be improved.

Based on a design layout, elements 13, such as a transistor, are formed in the first face 12a side of the semiconductor substrate 12 according to an ordinary method.

A first insulation film 14 is formed on the first face 12a covering the elements 13 by a conventionally known film deposition method, such as CVD.

In the interconnect section formation area 12c of the first insulation film 14, one or more contact holes 16 are formed which reach the element 13 through the first insulation film 14, and a plurality of dummy contact holes 18 are formed which reach the first face 12a through the first insulation film 14 without being connected to the element 13 outside of the interconnect section formation area 12c around the interconnect section formation area 12c. These contact holes 16 and dummy contact holes 18 can be simultaneously formed by same steps in a series of conventionally known resist coating step, resist pattern formation step based on a photolithography, and an etching step using this resist pattern as a mask.

If the dummy contact holes 18 are formed only in the partitioned areas matching the above conditions, an opening pattern of a resist pattern is patterned such that the dummy contact holes 18 can be formed in the predetermined partitioned areas, and then etching processing is performed.

Then buried contacts 16a are formed which fill the contact holes 16. Dummy buried contacts 18a are formed which fill the dummy contact holes 18.

A barrier film which is the so called "barrier metal", and which is not illustrated, may be deposited on an entire exposed faces of the contact holes 16 and dummy contact holes 18. For the barrier film, a conventionally known configuration of layered films made of titanium nitride (TiN) or titanium (Ti), for example, can be deposited according to the ordinary method.

The contact holes 16 and dummy contact holes 18 having barrier film are filled with such conductive material as tungsten (W) according to a conventionally known method, such as a sputtering method. An etch back step is performed to form the buried contacts 16a and dummy buried contacts 18a. By this etch back step, the top faces 16aa and 18aa thereof are aligned to a height of the surface 14a of the first insulation film 14.

As seen from FIG. 4B, a first interconnect layer 20 is formed. The first interconnect layer 20 is preferably formed by a conventionally known film deposition step, the photolithography step, and the etching step, and patterned to a desired interconnect pattern, using such metal material as an aluminum (Al) and a copper (Cu). The interconnect pattern to be formed here includes first dummy interconnect sections 24 which are connected to the dummy buried contacts 18a. In other words, the first dummy interconnect sections 24 are formed together with a first interconnect section 22 as a part of the first interconnect layer 20 by same steps.

The first interconnect section 22 is formed to be an interconnect of which a first edge 22a is electrically connected with the buried contact 16a, and a second edge 22b extends on a surface 14a of the first insulation film 14.

As seen from FIG. 4C, a second insulation film 30, which is a silicon oxide film and so on, is formed by an ordinary method such as a CVD method. The second insulation film 30 is formed as a film that covers the surface 14a of the first insulation film 14 and the first interconnect layer 20.

Then a via hole 32 and dummy via holes 34 are formed in the same way as the above-mentioned contact hole formation step, which extend through the second insulation film 30. The via hole 32 is formed to reach the second edge 22b of the first interconnect section 22 in the interconnect section formation area 12c. A plurality of dummy via holes 18 are formed through a part of the plurality of first dummy interconnect sections 24. The via hole 32 and dummy via holes 34 are formed together by same steps.

A buried via 32a that fills the via hole 32 and dummy buried via 34a that fill the dummy via holes 34 are formed together by same steps similar to the above-mentioned buried contact 16a and dummy buried contacts 18a.

Then a second interconnect layer 40 is formed, which includes a second interconnect section 42 and second dummy interconnect sections 44. The second interconnect section 42 is electrically connected to a top face 32aa of the buried via 32a, and is formed to extend on a surface 30a of the second insulation film 30. The second dummy interconnect sections 44 are formed to connect to top faces 34aa of the dummy buried vias 34a. These second interconnect section 42 and second dummy interconnect sections 44 are formed together by same steps.

A multi-layer interconnect structure (not illustrated) having a desired number of layers can be formed by using the second interconnect layer 40 as a second layer and repeating the steps of forming an interlayer insulation film covering an interconnect layer, a via hole formed in a interlayer insulation film, a plug that fills a via hole and is connected to the interconnect of the lower layer, and another interconnect layer that is connected to the plug.

A dicing is performed along the scribe lines, which are not illustrated, using a conventionally known dicing device, so that a plurality of the chip areas 1 are cut into chips, which have been set on the semiconductor substrate 12 in advance.

By the above steps, a plurality of semiconductor devices 10 having identical structures respectively in a format of a semiconductor chip can be fabricated from one semiconductor substrate (wafer) 12.

According to this fabrication method, dummy buried vias and dummy interconnect sections can be formed in a predetermined area without adding new steps. Therefore semiconductor devices having the above-mentioned structure can be efficiently fabricated at low cost.

This application is based on Japanese Patent Application No. 2005-214215 filed on Jul. 25, 2005, and the entire disclosure thereof is incorporated herein by reference.

What is claimed is:

1. A semiconductor device, comprising:
a semiconductor substrate including a first face and a second face opposite said first face, and further including a chip area on said first face and a plurality of interconnect section formation areas in said chip area;
a first insulation film on said first face of said semiconductor substrate, covering an element in said chip area;
buried contacts in one or more contact holes, the contact holes are in said interconnect section formation areas of said first insulation film and reach said element through said first insulation film;
dummy buried contacts in a plurality of dummy contact holes arranged outside of and around said interconnect section formation areas, the dummy buried contacts reach said first face through said first insulation film without connection to said element;
a first interconnect layer including a plurality of first interconnect sections each having a first edge electrically connected to said buried contacts and a second edge extending on a surface of said first insulation film, and including first dummy interconnect sections connected to the dummy buried contacts;
a second insulation film covering said surface of said first insulation film and said first interconnect layer;
a buried via in a via hole, the buried via extends through said second insulation film to reach said second edge of one of said first interconnect sections;
dummy buried vias in a plurality of dummy via holes, the dummy buried vias respectively reach parts of said plurality of first dummy interconnect sections; and
a second interconnect layer including a second interconnect section which is electrically connected to said buried via and extends on a surface of said second insulation film, and including second dummy interconnect sections connected to said dummy buried vias,
wherein each one of said dummy buried contacts are at a same distance from each adjoining one of said dummy buried contacts positioned in any one of front and aft directions and in any one of left and right directions, said dummy buried contacts surrounding each one of said buried contacts.

2. The semiconductor device according to claim 1, wherein a line length from said first edge to said second edge is 1 mm to 5 mm,
said via hole includes one or two via holes, and
a ratio of an opening area of said contact holes and said via holes to a surface area of said chip area is equal to or smaller than 2%.

3. The semiconductor device according to claim 1, wherein said dummy contact holes are arranged on an entire face of said chip area outside of and around said interconnect section formation areas.

4. The semiconductor device according to claim 1, wherein when said chip area is partitioned into a plurality of equal sized partition areas which are set in a matrix, and said dummy contact holes are formed only in said partitioned areas, a ratio of an opening area of said contact holes and said via hole to a surface area of the partitioned areas is less than 2%.

5. The semiconductor device according to claim 4, wherein each of said partitioned areas has an area of 0.01 $mm^2$.

6. The semiconductor device according to claim 1, wherein each of a plurality of dummy structures including said dummy buried contacts, said first dummy interconnect sections, said dummy buried vias and said second dummy interconnect sections extend vertically with respect to said first face, and adjacent dummy structures are separated from each other by an equal space.

7. The semiconductor device according to claim 6, wherein the space between said plurality of dummy structures, and a space between said dummy structures and both said interconnect section formation areas and said element are a shortest distance determined in accordance with a fabrication process rule applied.

8. The semiconductor device according to claim 1, further comprising a plurality of the buried vias, wherein each one of the dummy buried vias is at a corresponding same distance from each adjoining one of the dummy buried vias positioned in any one of the front and aft directions and in any one of the left and right directions, the dummy buried vias surround each one of the buried vias.

9. A method for fabricating a semiconductor device comprising:

preparing a semiconductor substrate having a first face and a second face opposite said first face;

setting a chip area on said first face and a plurality of interconnect section formation areas in said chip area;

forming an element on said first face of said semiconductor substrate;

forming a first insulation film that covers said element on said first face;

forming one or more contact holes which reach said element in said interconnect section formation area through said first insulation film, and a plurality of dummy contact holes arranged outside of and around said interconnect section formation areas, the dummy contact holes reach said first face through said first insulation film without connecting with said element;

forming buried contacts that fill said contact holes and dummy buried contacts that fill said dummy contact holes;

forming a first interconnect layer including a plurality of first interconnect sections each having a first edge electrically connected to said buried contacts and a second edge that extends on a surface of said first insulation film, and first dummy interconnect sections connected with the dummy buried contacts;

forming a second insulation film that covers said surface of said first insulation film and said first interconnect layer;

forming a via hole which extends through said second insulation film to reach said second edge of one of said first interconnect section, and a plurality of dummy via holes exposing parts of said plurality of first dummy interconnect sections;

forming a buried via that fills said via hole and dummy buried vias that fill said dummy via holes; and forming a second interconnect layer including a second interconnect section which is electrically connected to said buried via and extends on a surface of said second insulation film, and second dummy interconnect sections connected to said dummy buried vias, wherein each one of said dummy buried contacts are arranged at a same distance from each adjoining one of said dummy buried contacts positioned in any one of front and aft directions and in any one of left and right directions, said dummy buried contacts surrounding each one of said buried contacts.

10. The fabrication method for the semiconductor device according to claim 9, wherein a line length from said first edge to said second edge is 1 mm to 5 mm, said via hole includes one or two via holes, and a ratio of an opening area of said contact holes and said via holes to a surface area of said chip area is equal to or smaller than 2%.

11. The fabrication method for the semiconductor device according to claim 9, wherein said forming said contact holes and said dummy contact holes comprises forming said plurality of dummy contact holes as arranged on an entire face of said chip area outside of and around said interconnect section formation areas.

12. The fabrication method for the semiconductor device according to claim 9, further including, after said setting said chip area and said interconnect section formation area, setting a plurality of partitioned areas of a same size in said chip area in a matrix, wherein said forming the contact holes and the dummy contact holes includes setting a ratio of an opening area of said contact holes and said via hole to a surface area of said partitioned areas to be less than 2% for every said plurality of partitioned areas.

13. The fabrication method for the semiconductor device according to claim 12, wherein said setting the ratio includes assuming an area of each of said partitioned areas is 0.01 $mm^2$.

14. The fabrication method of the semiconductor device according to claim 9, wherein each of a plurality of dummy structures including said dummy buried contacts, said first dummy interconnect sections, said dummy buried vias and said second dummy interconnect sections extend vertically with respect to said first face, and adjacent dummy structures are formed separated from each other by an equal space.

15. The fabrication method for the semiconductor device according to claim 14, wherein said dummy structures are formed by setting the space between said plurality of dummy structures, and a space between said dummy structures and both said interconnect section formation areas and said element to be a shortest distance determined in accordance with a fabrication process rule applied.

16. The fabrication method for the semiconductor device according to claim 9, wherein a plurality of buried vias are formed, and wherein each one of the dummy buried vias is at a corresponding same distance from each adjoining one of the dummy buried vias positioned in any one of the front and aft directions and in any one of the left and right directions, the dummy buried vias surround each one of the buried vias.

* * * * *